US007400196B2

(12) United States Patent
Wyatt

(10) Patent No.: US 7,400,196 B2
(45) Date of Patent: Jul. 15, 2008

(54) ULTRA WIDE BAND, DIFFERENTIAL INPUT/OUTPUT, HIGH FREQUENCY AMPLIFIER IN AN INTEGRATED CIRCUIT

(75) Inventor: Michael A. Wyatt, Clearwater, FL (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 77 days.

(21) Appl. No.: 11/504,431

(22) Filed: Aug. 15, 2006

(65) Prior Publication Data

US 2008/0018405 A1 Jan. 24, 2008

Related U.S. Application Data

(60) Provisional application No. 60/817,387, filed on Jun. 29, 2006.

(51) Int. Cl.
*H03F 3/18* (2006.01)
(52) U.S. Cl. .................. 330/263; 330/302; 330/258; 330/311
(58) Field of Classification Search .................. 330/263, 330/302, 258, 311
See application file for complete search history.

(56) References Cited

U.S. PATENT DOCUMENTS 6,624,699 B2 * 9/2003 Yin et al. ..................... 330/260
6,683,498 B2 * 1/2004 Burns et al. .................. 330/261
6,774,721 B1 * 8/2004 Popescu et al. ............. 330/253
7,170,349 B2 * 1/2007 Bhattacharjee et al. ...... 330/254

OTHER PUBLICATIONS

Chris D. Holdenried et al., "Analysis and Design of HBT Cherry-Hooper Amplifiers With Emitter-Follower Feedback for Optical Communications", IEEE vol. 39, No. 11, Nov. 2004, pp. 1959-1967.
Adrian Maxim, "A 3.3V 10Gb/s SiGe Limiting Transimpedance Amplifier Using a Pseudo-Differential Input and a Limiting Cherry-Hooper Stage", IEEE, 2005.

* cited by examiner

*Primary Examiner*—Patricia Nguyen
(74) *Attorney, Agent, or Firm*—RatnerPrestia

(57) ABSTRACT

A wide band amplifier includes a core amplifier having input terminals and output terminals for, respectively, receiving differential input signals and providing amplified differential output signals. A bandwidth peaking network is coupled to the core amplifier and includes (a) a first coil and a first resistor connected in series and (b) a second coil and a second resistor connected in series. The first coil and resistor and the second coil and resistor, respectively, are coupled to the core amplifier for receiving the amplified differential output signals. The bandwidth peaking network is configured to increase the frequency bandwidth of the amplifier. The bandwidth peaking network includes (a) a first node formed between the first coil and resistor, (b) a second node formed between the second coil and resistor, and (c) a third resistor is connected between the first node and the second node. This resistor is free of current flow at low frequency operation of the amplifier.

20 Claims, 16 Drawing Sheets

80

| Q1 | Q2 |
|----|----|
| Q19 | Q76 |

| HALF R36A | HALF R36B |
|-----------|-----------|
| HALF R36B | HALF R36A |

FIG. 9

ULTRA WIDE BAND, DIFFERENTIAL INPUT/OUTPUT, HIGH FREQUENCY AMPLIFIER IN AN INTEGRATED CIRCUIT

CROSS REFERENCE TO RELATED APPLICATIONS

This application claims priority of U.S. Provisional Patent Application Ser. No. 60/817,387, filed Jun. 29, 2006.

FIELD OF THE INVENTION

The present invention relates, in general, to a high frequency amplifier. More specifically, the present invention relates to an ultra wide band (from dc to greater than 20 GHz), substantially constant gain amplifier that is fabricated as an integrated circuit, and has differential input/output signal capabilities.

BACKGROUND OF THE INVENTION

An amplifier that provides linear amplification, as compared to an amplifier that operates in the saturation region, receives an input signal and generates an output signal having a predetermined amount of gain. The frequency components of the output signal are generally similar to the frequency components of the input signal.

In some applications, there is a requirement that an amplifier provide a constant gain across its entire frequency response or bandwidth. In some other applications, there is a requirement that the input terminals of the amplifier be capable of receiving a differential pair of signals and the output terminals of the amplifier be capable of outputting an amplified differential pair of signals.

It is difficult to fabricate a wide band amplifier on a die for use as an integrated circuit (IC). It is even more difficult to fabricate an ultra wide band amplifier on a die having a constant gain across a frequency band that spans from direct current (dc) up to a frequency in excess of 20 GHz. The present invention addresses such an amplifier.

SUMMARY OF THE INVENTION

To meet this and other needs, and in view of its purposes, the present invention provides a wide band amplifier including (1) a core amplifier having input terminals and output terminals for, respectively, receiving differential input signals and providing amplified differential output signals, (2) a bandwidth peaking network having (a) a first coil and a first resistor connected in series, and (b) a second coil and a second resistor connected in series, and (3) the first coil and resistor and the second coil and resistor, respectively, are coupled to the core amplifier for receiving the amplified differential output signals. The bandwidth peaking network is configured to increase the frequency bandwidth of the amplifier.

The bandwidth peaking network includes (a) a first node formed between the first coil and resistor, (b) a second node formed between the second coil and resistor, and (c) a third resistor connected between the first node and the second node. The third resistor is free of any current flow at low frequency operation of the amplifier.

The amplifier further includes a common mode bias network coupled between the output terminals for providing a voltage bias control feedback signal across the input terminals. The voltage bias control feedback signal is derived from a virtual ground common mode potential across the output terminals.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures:

FIGS. 8 and 9 are layouts showing the partitioning of transistors and resistors, which are located in a common centroid arrangement on a die, in accordance with an embodiment of the present invention;

DETAILED DESCRIPTION OF THE INVENTION

As will be described, the present invention provides an ultra wide band amplifier, operating between direct current (dc) and frequencies greater than 20 GHz. The present invention includes a bandwidth peaking network that extends the frequency response of the amplifier and provides a nearly constant gain across the ultra wide band of the amplifier. In addition, the present invention receives a pair of differential input signals and transmits a pair of differential output signals. The present invention also includes a controlled input impedance and a controlled output impedance. Moreover, the present invention operates with a low supply voltage and includes a common mode biasing method for AC applications, and an accurate fixed ratio bias tracking scheme. These features all contribute to advantageous improvements of an ultra wide band amplifier that is disposed on a die and fabricated for use in an integrated circuit (IC) or chip.

Figure 1:
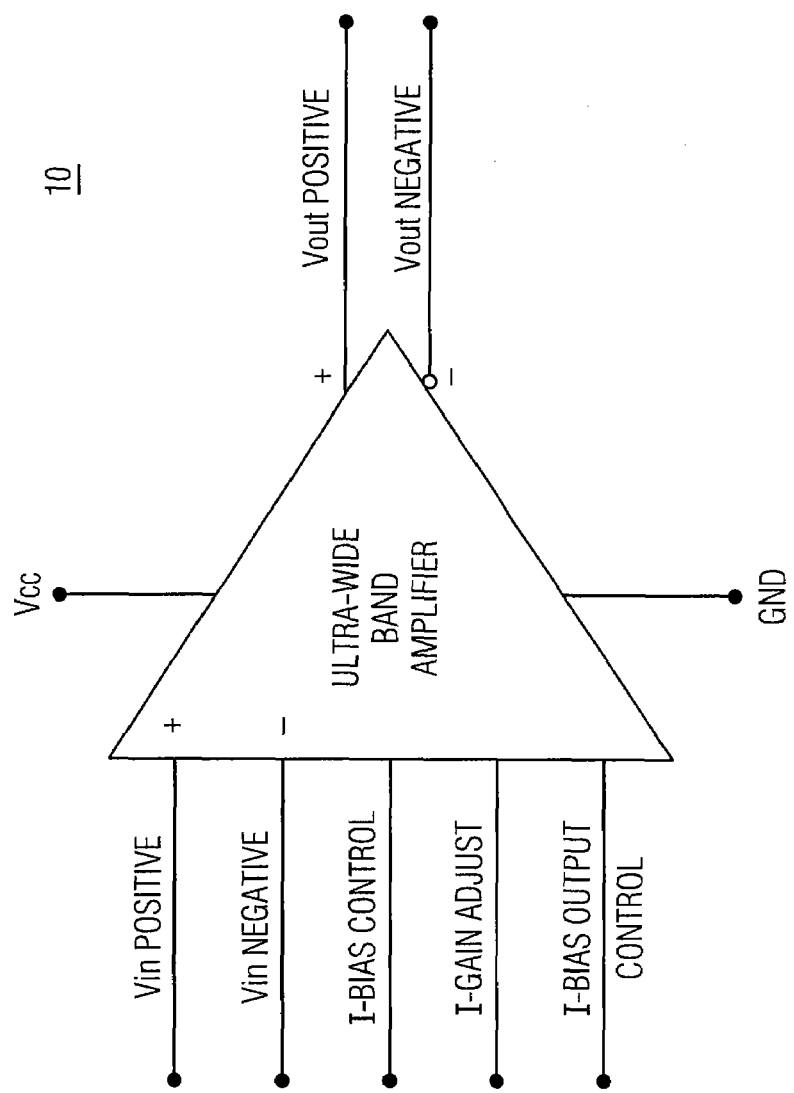
FIG. 1 is a functional diagram of the input and output signals of an ultra wide band amplifier, in accordance with an embodiment of the present invention.

Referring to FIG. 1, there is shown a functional input/output block diagram of an ultra wide band amplifier, generally designated as 10. In accordance with an embodiment of the present invention, ultra wide band amplifier 10 includes differential voltage input signals, shown as Vin positive and Vin negative. The ultra wide band amplifier 10 also includes differential output signals, shown as Vout positive and Vout negative. The ultra wide band amplifier 10 also includes biasing controls, shown as current (I)-bias control, I-gain adjust control and I-bias output control. These different biasing and gain adjust controls will be described later. Lastly, as shown in FIG. 1, ultra wide band amplifier 10 includes a VCC primary power input of nominally 3.0 volts and a ground potential.

Figure 2:
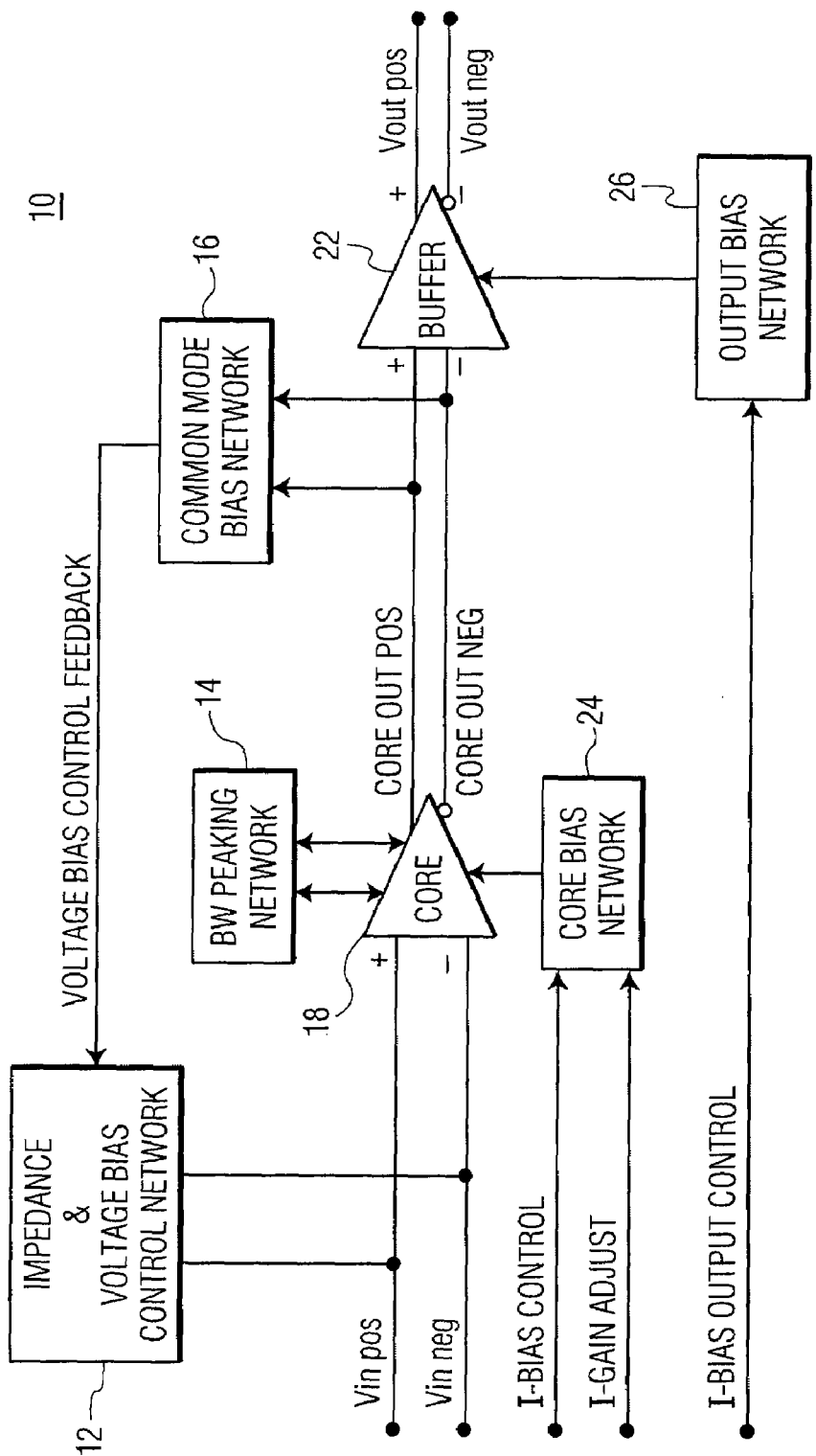
FIG. 2 is a functional block diagram of the ultra wide band amplifier shown in FIG. 1, in accordance with an embodiment of the present invention.

A functional block diagram of the ultra wide band amplifier is shown in FIG. 2. As shown, ultra wide band amplifier 10 includes core amplifier 18, which receives the positive voltage input (Vin pos) and the negative voltage input (Vin neg), being a pair of differential input signals. The pair of differential output signals from core amplifier 18, namely the core output positive signal and the core output negative signal, are buffered by buffer 22 to provide the voltage output positive signal and the voltage output negative signal.

The biasing of the transistors of core amplifier 18 (shown in FIG. 3) is provided by core bias network 24, which in turn is controlled by two input control signals of I-bias control and I-gain adjust control. Biasing of the transistors of buffer 22 (shown in FIG. 4) is provided by output bias network 26, which in turn is controlled by an input signal of I-bias output control.

Core amplifier 18 provides a gain adjusted, constant amplification of 10 dBv across an ultra wideband spanning from zero (dc) up to at least 20 GHZ frequency. The gain value of core amplifier 18 is maintained uniformly across the entire wide band of the amplifier, by use of bandwidth (BW) peaking network 14.

Ultra wide band amplifier 10 also includes tightly controlled input and output impedances. The input impedance is controlled by way of impedance and voltage bias control network 12, which in turn receives a voltage bias control feedback signal from common mode bias network 16. The common mode bias network 16 senses the voltage across the input terminals of buffer 22, as shown in FIG. 2. As will be described later, common mode bias network 16 includes a center tap node, which feeds back a common voltage to the impedance and voltage bias control network 12 at the input terminals of ultra wide band amplifier 10. Consequently, the same voltage bias value is supplied to the positive voltage input terminal and the negative voltage input terminal.

Figure 3:
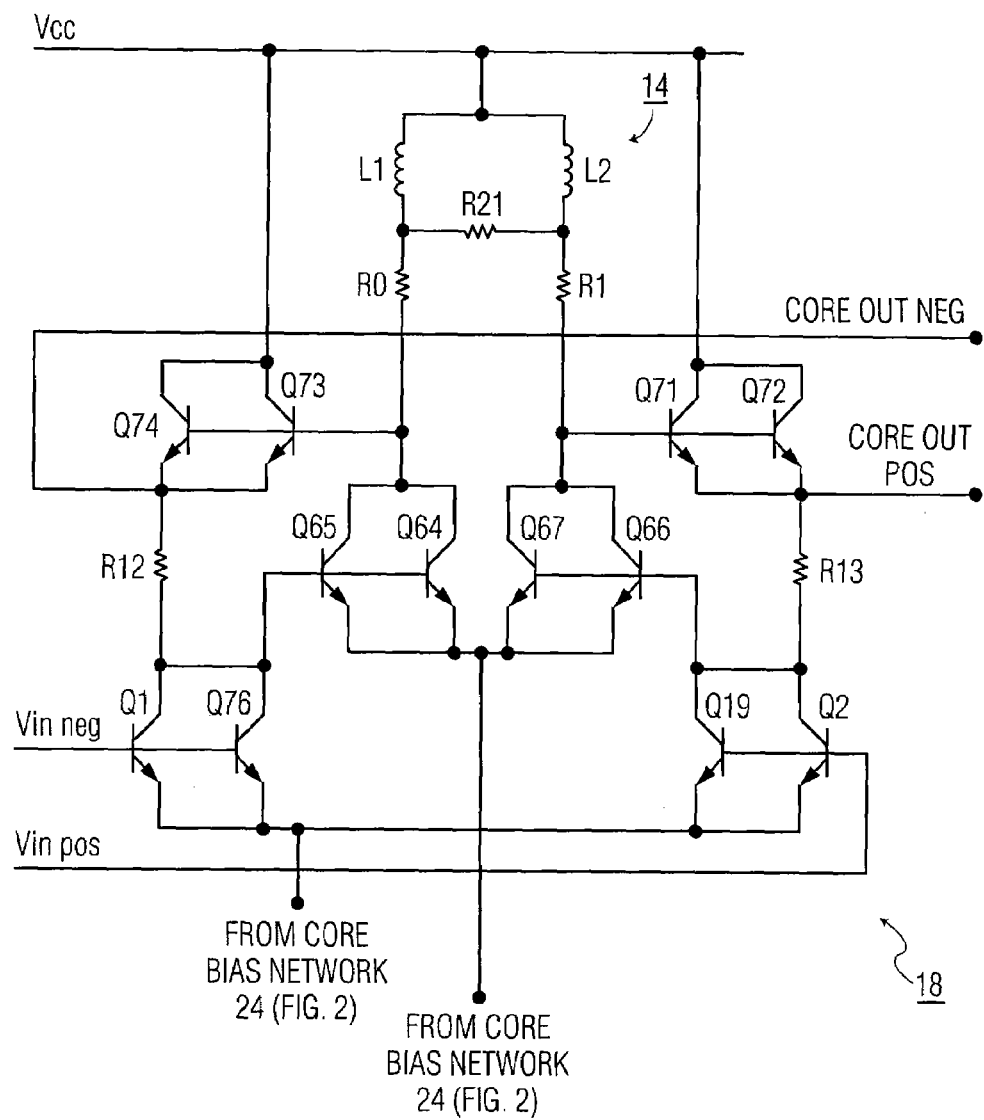
FIG. 3 is a schematic diagram of a bandwidth peaking network and a core amplifier shown in FIG. 2, in accordance with an embodiment of the present invention.

Referring next to FIG. 3, there is shown greater detail of core amplifier 18 and bandwidth peaking network 14. In the embodiment shown in FIG. 3, transistors Q1 and Q76 are physically two separate transistors on the die; it will be appreciated, however, that transistors Q1 and Q76 behave as one transistor (it is noted that the bases of the transistors are connected; the collectors of the transistors are connected; and the emitters of the transistors are connected). Similarly, transistors Q2 and Q19 behave as one transistor; transistors Q73 and Q74 behave as one transistor; transistors Q71 and Q72 behave as one transistor; transistors Q64 and Q65 behave as one transistor; and transistors Q66 and Q67 behave as one transistor.

A negative voltage input signal is provided into core amplifier 18 by way of the bases of transistors Q1 and Q76; and a positive voltage input signal is provided into core amplifier 18 by way of the bases of transistors Q2 and Q19. The output signals, namely the core out negative signal and the core out positive signal, are provided as output differential signals by way of, respectively, the emitters of transistors Q73 and Q74, and the emitters of transistors Q71 and Q72. In this manner, core amplifier 18 effectively provides a pair of differential output signals.

The biasing of the transistors of core amplifier 18 is provided by way of core bias network 24 (FIG. 2). As shown in FIG. 3, the emitter of each transistor Q1, Q76, Q19 and Q2 is connected to core bias network 24. Each of these four emitters is biased by the same bias current (I). Another biasing current (I) is provided from core bias network 24 for biasing the emitter of each transistor Q65, Q64, Q67 and Q66. Each of these four emitters is biased by the same current (I).

The collector output current from the combination of transistors Q1 and Q76 is provided as an input current into the bases of the combination of transistors Q64 and Q65. In a similar manner, the collector output current from the combination of transistors Q2 and Q19 is provided as an input current into the bases of the combination of transistors Q66 and Q67.

The current flowing from the collectors of transistors Q64 and Q65 is provided to a first set of resistor and inductor combination, namely R0 and L1 of bandwidth peaking network 14. Similarly, the collector current provided by the combination of transistors Q66 and Q67 flows through a second set of resistor and inductor combination, namely R1 and L2 of bandwidth peaking network 14. Another resistor, designated as R21, which is disposed between a node of R0 and L1 and another node of R1 and L2, is also configured to receive current from transistors Q64, Q65, Q66 and Q67.

It will be appreciated that the current flowing in the collectors of Q64, Q65 and the current flowing in the collectors of Q66, Q67 start rolling-off at a first predetermined frequency. On the other hand, with bandwidth peaking network 20 included in the present invention, as shown in FIG. 3, the impedance seen at the collectors of Q64, Q65, Q66 and Q67 increases with frequency compensating for the collector current roll-off.

Figure 11A:
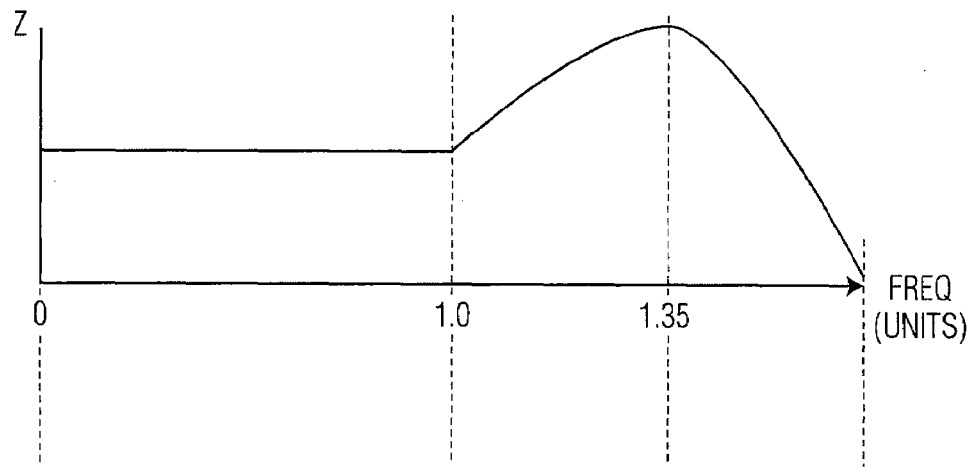
FIG. 11A is a plot of impedance level (Z) versus frequency (in arbitrary units)
Figure 11B:
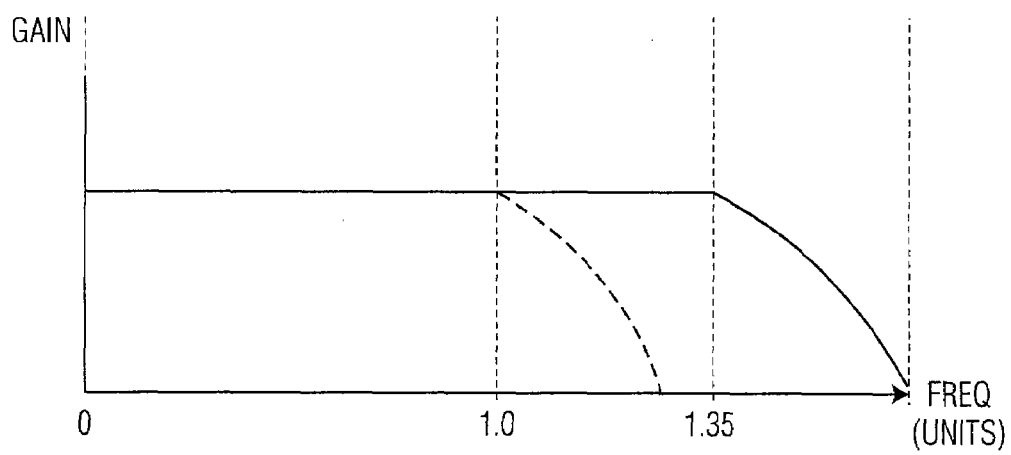
FIG. 11B is a plot of gain (dBv) versus frequency (in arbitrary units)

The inventor has discovered that, preferably by experimentation, the gain provided by core amplifier 18 may be adjusted to have a substantially constant gain level from its lowest frequency response up to its maximum frequency response. This phenomenon is best shown by referring to FIGS. 11A and 11B. FIG. 11A provides a plot of impedance (Z) seen by Q64, Q65, Q66 and Q67, respectively, versus frequency in arbitrary units, and FIG. 11B provides a plot of gain versus frequency in arbitrary units. The inventor has shown that bandwidth peaking network 14 increases the frequency response of ultra wide band amplifier 10 by as much as 35 percent. For example, if one unit is defined as 11 GHZ, then 1.35 units is at 15 GHZ and, correspondingly, the upper frequency response of ultra wide band amplifier 10 is also at 15 GHz. As another example, if one unit is defined as 16 GHZ, then 1.35 units is at 21.5 GHZ and, correspondingly, the upper frequency response of ultra wide band amplifier 10 is also at 21.5 GHz.

In operation, bandwidth peaking network 14 provides a substantially constant impedance level of Z up to 1.0 frequency units. From 1.0 frequency units up to 1.35 frequency units, the impedance level of Z increases, as shown in FIG. 11A. As a result, the gain of core amplifier 18, resulting from the combination of transistors Q64, Q65, Q66 and Q67 extends at a substantially constant value until reaching the frequency of 1.35 units, as shown in FIG. 11B.

The inventor has found that preferably R0 has a value that is similar to the value and physical construction of R1; furthermore, R21 may be selected to be substantially identical to R0 or R1. Additionally, transistors Q64, Q65, Q66 and Q67 are preferably silicon germanium (SiGe) transistors which have a maximum transition frequency of 120 GHZ. It will be appreciated that at the lower frequencies, bandwidth peaking network 14 presents an impedance that is substantially resistive in value. This is due to L1 and L2 having an inductive low impedance at the lower frequencies. Consequently, R1 and R0 are effectively directly connected to VCC, which results in R21 being free-of any current flow.

It will be understood that the number and values of the components of bandwidth peaking network 14 on the die of the integrated circuit are complex. This is because there are many parasitic capacitances that exist between points across each physical resistor and points on the substrate of the die. Similarly, there are many parasitic capacitances that exist between points of each coil and points on the substrate. The impedance level Z varies as a function of frequency and is too complicated to calculate. As a result, the inventor prefers to find the resistive values of R0, R1 and R21 and the inductive values of L1 and L2 (which are equal to each other by symmetry) by experimentation. By experimentally adjusting the output gain response of core amplifier 18 to be at a constant gain of 10 dBv, across the entire frequency bandwidth, the values of R0, R1, R21, L1 and L2 may be determined.

The manner is which the gain of core amplifier 18 is maintained at a constant value may be seen from the following simplified equations:

$$Vout = I(\omega) \cdot Z(\omega)$$

$$I(\omega) = Vin \cdot gm(\omega)$$

$$Vout = Vin \cdot gm(\omega) \cdot Z(\omega)$$

$$Vout/Vin = gm(\omega) \cdot Z(\omega)$$

where:
$gm(\omega)$ is the transconductance of the transistor as a function of frequency ($\omega$),
$Z(\omega)$ is the impedance presented to the transistor, and
Vout/Vin is the gain of the amplifier.

The values of $Z(\omega)$ presented to core amplifier 18 by the bandwidth peaking network 14 (which includes resistance, inductances and parasitic capacitances) are adjusted so that the gain of ultra wide band amplifier 10 is maintained at a constant value over the desired frequency range.

Still referring to FIG. 3, there is shown resistor R12 connected between the collectors of transistor combination Q1 and Q76 and the emitters of transistor combination Q73 and Q74. Similarly, resistor R13 is connected between the collectors of the combination of transistors Q2 and Q19 and the emitters of the combination of transistors Q71 and Q72.

The positive core output and negative core output differential signals are buffered by buffer 22 (FIG. 2), before the positive voltage output and negative voltage output differential signals are transmitted from ultra wide band amplifier 10. Buffer 22 is shown in more detail in FIG. 4. As shown, buffer 22 includes two transistors, designated as Q83 and Q85. The collector of each of these transistors is connected to VCC (nominally 3.0 volts), the base of each transistor receives one of the differential core output signals from core amplifier 18, and the emitter of each transistor is biased by output bias network 26 (FIG. 2). The final differential output signals, namely Vout positive and Vout negative are provided by the emitters of transistors Q83 and Q85, respectively. Thus, Q83 and Q85 behave as emitter followers and provide a gain value of less than one to the differential output signals of core amplifier 18.

Figure 4:
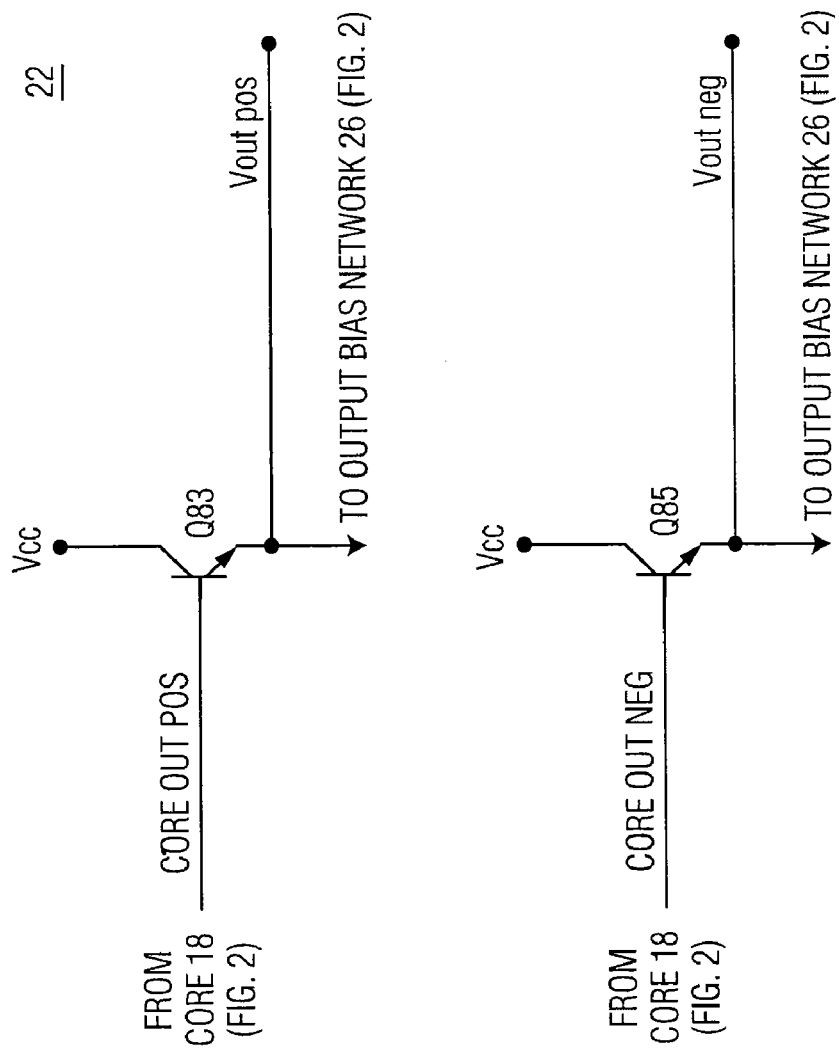
FIG. 4 is a schematic diagram of a buffer shown in FIG. 2, in accordance with an embodiment of the present invention.
Figure 5:
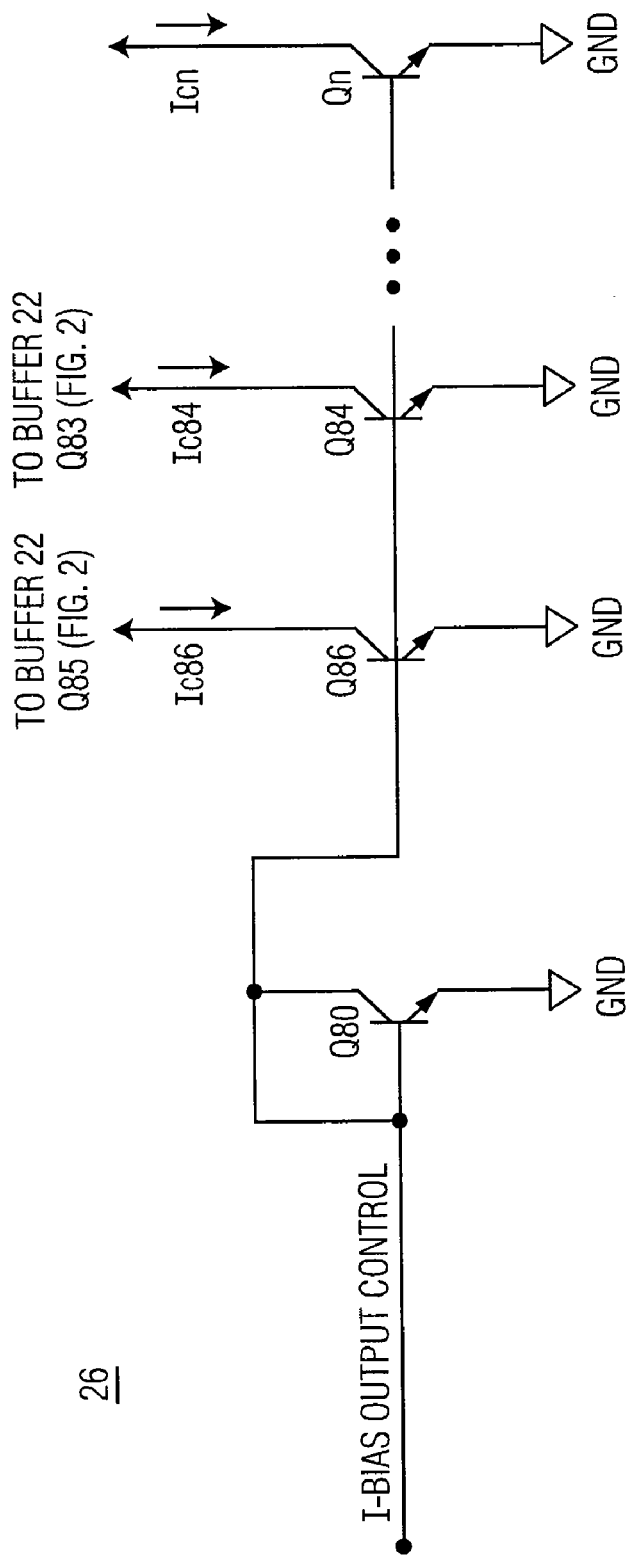
FIG. 5 is a schematic diagram of an output bias network shown in FIG. 2, in accordance with an embodiment of the present invention.

The biasing of the emitters of transistors Q83 and Q85 is shown in greater detail in FIG. 5. As shown, output bias network 26 provides a current bias to Q85 of buffer 22 (FIGS. 2 and 4). A collector current flowing in transistor Q86 is shown designated as Ic86. Similarly, transistor Q84 provides a collector current of Ic84 to transistor Q83 of buffer 22 (FIGS. 2 and 4). It will be appreciated that the bases of transistors Q86 and Q84 are connected to each other and similarly controlled by the input signal of I-bias output control provided to transistor Q80. As shown, transistor Q80 has its collector and base connected together and coupled into output biasing transistors Q86 and Q84. Accordingly, the collector current of each of transistors Q86 and Q84 is substantially the same and the biases seen by the transistors of buffer 22 are equal to each other.

More generally, output bias network 26 may include N biasing transistors in a chain, as shown. Each of the N biasing transistors have their bases connected together and coupled to input transistor Q80. The input signal of I bias output control, which controls each transistor in the chain, may be used to set equal bias values to other transistors (not shown) in an output buffer stage (for example, buffer 22).

Figure 6:
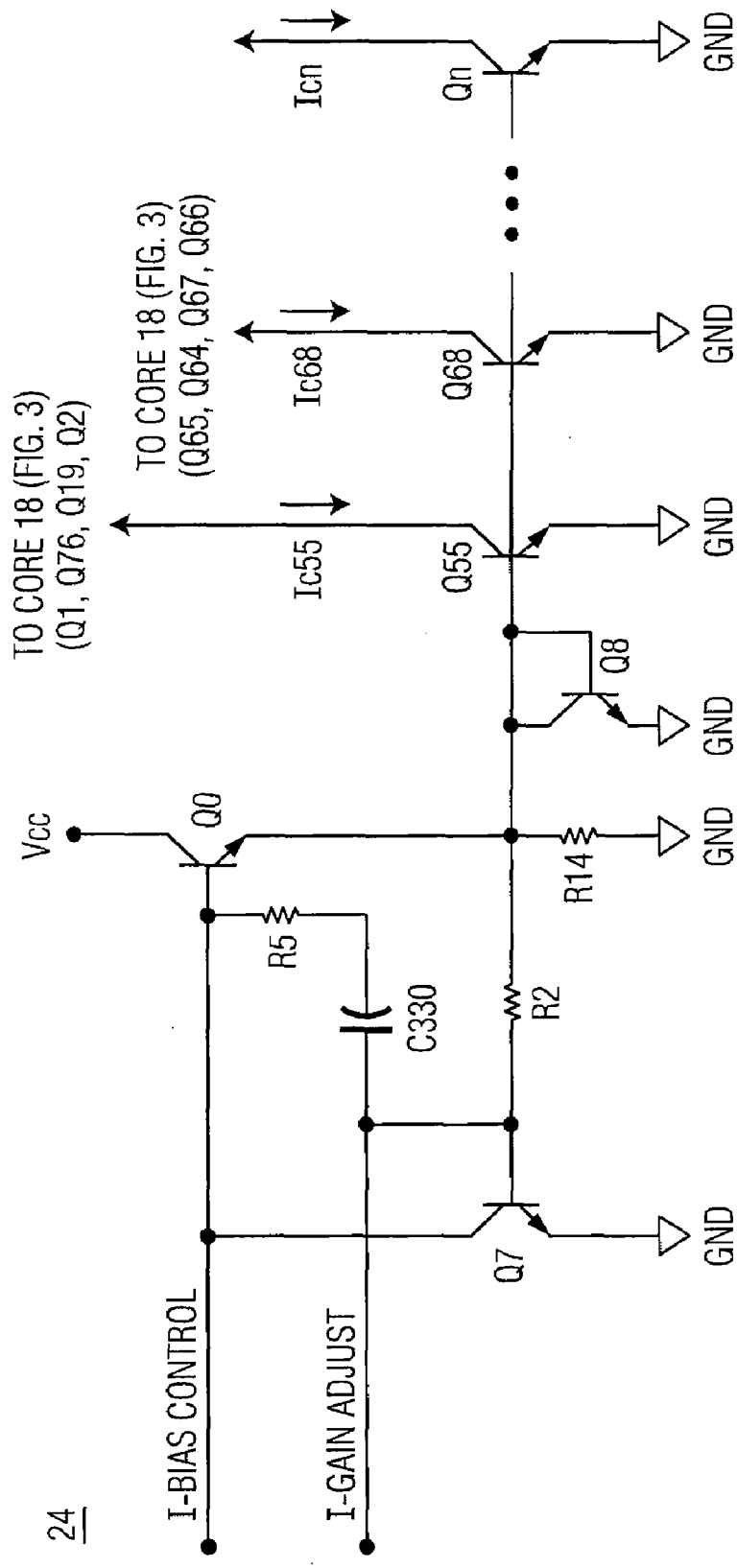
FIG. 6 is a schematic diagram of a core bias network shown in FIG. 2, in accordance with an embodiment of the present invention.

Having described output bias network 26, core bias network 24 will now be described. Referring to FIG. 6, there is shown core bias network 24. As shown, the core bias network is controlled by two different input signals. The first input signal is I-bias control, which, for example, may have a nominal value of 500 μa in this embodiment. The second input signal is I-gain adjust, which, for example, may have a value of 10 μa per dB of gain reduction with a nominal range of 0 to 100 μa for an amplifier gain of 10 dBv. The I-bias control signal is provided to the base of transistor Q0 and the I-gain adjust signal is provided into the base of transistor Q7. The I-gain adjust signal is also received by the base of transistor Q0 by way of a compensation network, shown as R5 and C330. Transistor Q8 and resistor R14 are bleeding elements and prevent the gain slope reversal that may happen for large values of I-gain.

The bases of biasing transistors Q55, Q68, up to Qn are connected together at the junction of R2 and R14. As a result, each of these biasing transistors provides the same biasing current to respective transistors of core amplifier 18. As shown, biasing transistor Q55 provides biasing current Ic55 to transistors Q1, Q76, Q19 and Q2 of core amplifier 18. Similarly, biasing transistor Q68 provides the biasing current of Ic68 to transistors Q65, Q64, Q67 and Q66 of core amplifier 18. Q55 and Q68 provide bias currents related to their physical size relationship with respect to reference transistor Q7. In general, there may be additional core biasing transistors placed in a chain, as shown in FIG. 6, such as Qn, which may be used to bias additional transistors (not shown) of another exemplary core amplifier.

In operation, an increase in I-bias control provides additional current flowing through the collectors of the biasing transistors (Q55, Q68, . . . , Qn) which, in turn, provide an increase in respective collector currents flowing into core amplifier 18. In this manner, an increase in I-bias control results in an increase in gain of core amplifier 18.

Working in an opposite manner, an increase in I-gain adjust results in an increased IR (voltage) drop across resistor R2 and a decreased IR drop across resistor R14. Consequently, as I-gain adjust increases, the current flowing into biasing transistors Q55, Q68, up to Qn decreases in value. This, in turn, causes a decrease in the collector currents of biasing transistors Q55, Q68, up to Qn. A decrease in the collector currents of these biasing transistors reduces the gain of core amplifier 18.

Core biasing network 24 may include biasing transistors (for example Q55, Q68, . . . Qn) that provide corresponding collector currents (for example Ic55, Ic68, . . . Icn) that are different from each other. As an example, Q68 may be required to provide a collector current of Ic68 at a value of 2 ma, whereas Q55 may be required to provide a collector current of Ic55 at a value of 1 ma. Such biasing ratio of 2 ma/1 ma may be achieved by implementing transistor Q68 to be physically twice as large as transistor Q55. As another example, Q68 may be required to provide a collector current of Ic68 at a value of 4 ma, whereas Q55 may be required to provide a collector current of Ic55 at a value of 1 ma. Such biasing ratio of 4 ma/1 ma may be achieved by implementing transistor Q68 to be physically four times larger than transistor Q55. In this manner, the present invention maintains the desired biasing currents to core amplifier 18 at a fixed ratio that is based on the physical size relationship among the biasing transistors.

Figure 7:
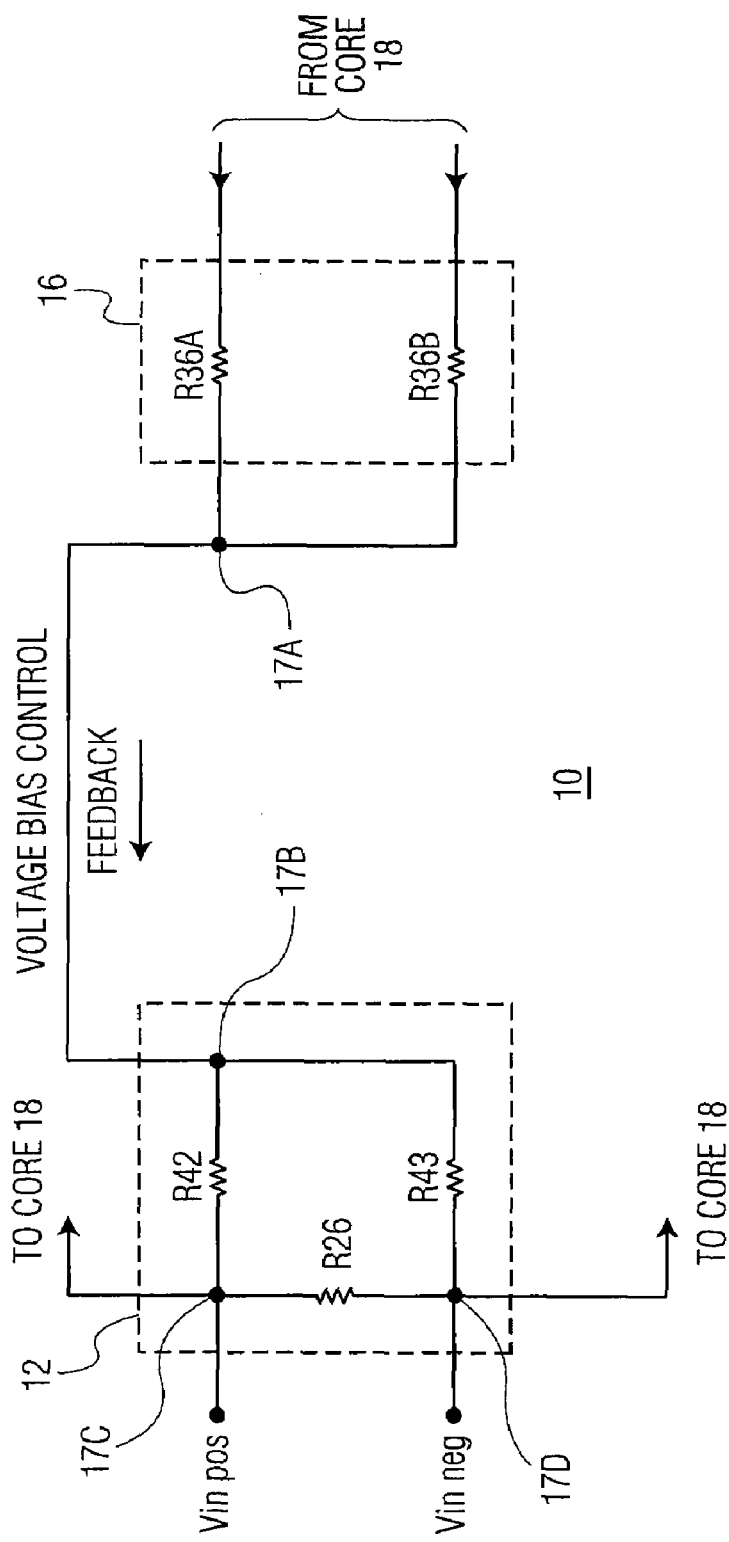
FIG. 7 is a schematic diagram of a common mode bias network and an impedance and voltage bias control network shown in FIG. 2, in accordance with an embodiment of the present invention.

Referring next to FIG. 7, the common mode bias network, designated as 16, and the impedance and voltage bias control network, designated as 12, will now be described.

The differential output from core amplifier 18 (FIG. 2), namely the voltage difference between the core out positive signal and the core out negative signal, is sensed by common mode bias network 16 by way of resistor R36A and resistor R36B. Since the signal voltage across R36A and R36B is equal in magnitude but opposite in sign, node 17A is effectively a virtual ground (Vg) and includes the common mode voltage generated between the positive signal output (core out positive) and the negative signal output (core out negative). This common mode voltage at node 17A is sensed by (or fed back to) node 17B as the voltage bias control feedback signal. Node 17C and node 17D, in turn, sense substantially the same common mode voltage that is present at node 17B.

In operation, common mode bias network 16 senses the differential output voltage of core amplifier 18 and establishes a common center point as the common mode voltage. The common mode voltage is fed back to impedance and voltage bias control network 12. The common mode voltage is split into two halves by way of resistors R42 and R43 to establish a common voltage bias at the input to core amplifier 18 (transistors Q1, Q76, Q19 and Q2 shown in FIG. 3).

The input impedance is controlled by network 12 by way of resistor R26, which is connected between resistors R42 and R43. These resistors set the input impedance at a desired value, which typically is 50 ohms single ended, and 100 ohms differential. Moreover, since the impedance level looking back from core amplifier 18 has a high value, resistor R26 effectively establishes the impedance value at the input terminals of Vin positive and Vin negative. In the exemplary embodiment, the impedance level is 100 ohms between nodes 17C and 17D, and the impedance level is 50 ohms between each terminal and ground potential.

Figure 10:
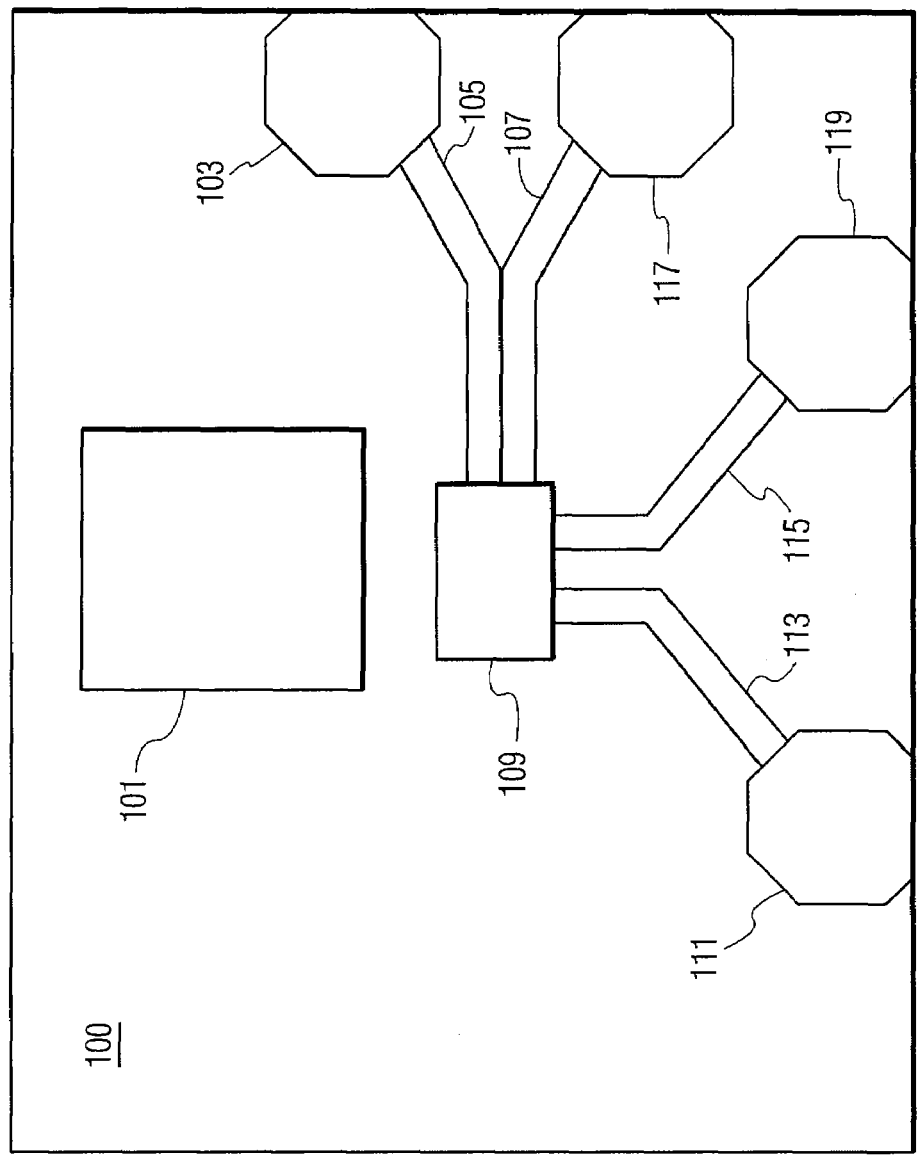
FIG. 10 is a layout diagram showing approximate sizes of various elements of the ultra wide band amplifier of FIG. 2, in accordance with an embodiment of the present invention.

It will be understood that ultra wide band amplifier 10 is entirely fabricated on a substrate of a die for use as an integrated circuit. The layout of the various components shown in FIG. 2 is complex and configured using CAD tools. A functional high level block diagram of the die, generally designated as 100, is shown in FIG. 10. It will be understood that FIG. 10 is not drawn to scale and much of the layout detail is not shown. The die 100 of the integrated circuit includes an area of approximately 1000 microns by 1000 microns. The input and output pads (designated as 111, 119, 103 and 117) as well as the voltage and ground pads (not shown) are approximately 100 microns by 100 microns each.

The Y-shaped lines shown in FIG. 10 are the input transmission lines (designated as 113 and 115), which are disposed between the voltage input pads (111, 119) and the core amplifier (designated as 109). Similarly, the Y-shaped output transmission lines (designated as 105 and 107) are disposed between the output buffer (shown as part of core amplifier 109) of the ultra wide band amplifier and the output voltage pads (103, 117). Also shown in FIG. 10 is the bandwidth peaking network, designated as 101, which is physically larger than core amplifier 109. The core amplifier has a size of approximately 100 microns by 30 microns.

Each of the transmission lines has a controlled impedance of 50 ohms. The width of each transmission line is approximately 25 microns.

It will be appreciated that the transistors and the resistors are configured on the die to have a common centroid arrangement. For example, the transistors shown schematically in FIG. 3, namely Q1, Q76, Q19 and Q2 are arranged as shown in FIG. 8. The arrangement of these four transistors is shown designated generally as 80. Similarly, the resistors of common mode bias network 16, shown schematically in FIG. 7, are also configured on the die in a common centroid arrangement. As shown in FIG. 9, resistor R36A and resistor R36B are configured as one half of resistor R36B disposed in the first quadrant of arrangement 90 and the other half of resistor R36B disposed in the third quadrant of arrangement 90. Similarly, resistor R36A is divided in half as shown, where one half is disposed in the second quadrant and the other half is disposed in the fourth quadrant.

Figure 12:
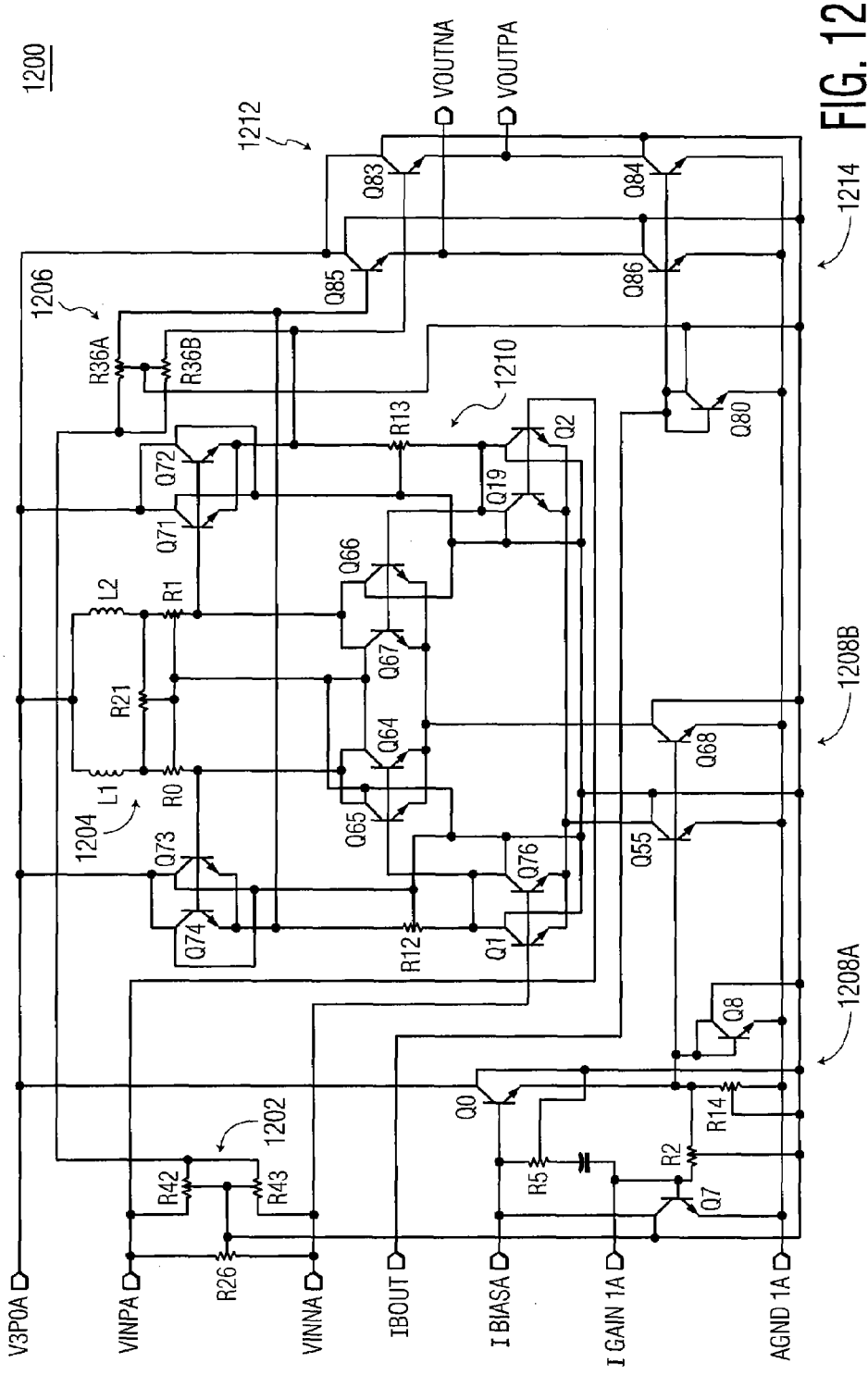
FIG. 12 is a detailed schematic diagram of the ultra wide band amplifier shown in FIGS. 1 and 2, in accordance with an embodiment of the present invention.

FIG. 12 depicts the ultra wide band amplifier in greater detail. As shown, ultra wide band amplifier 1200 includes impedance and voltage bias control network 1202 and common mode bias network 1206 (previously described by reference to FIG. 7). Also shown in FIG. 12 is bandwidth peaking network 1204 and core amplifier 1210 (previously described by reference to FIG. 3). Buffer 1212 and output bias network 1214 (previously described, respectively, in FIG. 4 and FIG. 5) are shown on the right hand side of FIG. 12. Lastly, core bias network 1208A and 1208B are shown at the bottom portion of FIG. 12 and have previously been described by reference to FIG. 6.

Also shown in FIG. 12 are connections from each transistor to the substrate of the die, connections from each resistor to the substrate, and connections from each coil (L1 and L2) to the substrate. These connections have been omitted in the other figures of ultra wide band amplifier 10. The ultra wide band amplifier shown in FIG. 12 is implemented using selective-epitaxial SiGe bipolar transistors. The transistors shown in FIG. 12 may also be implemented using other materials including, but not limited to silicon, GaAs, InP, and AlGaAs.

Figure 13:
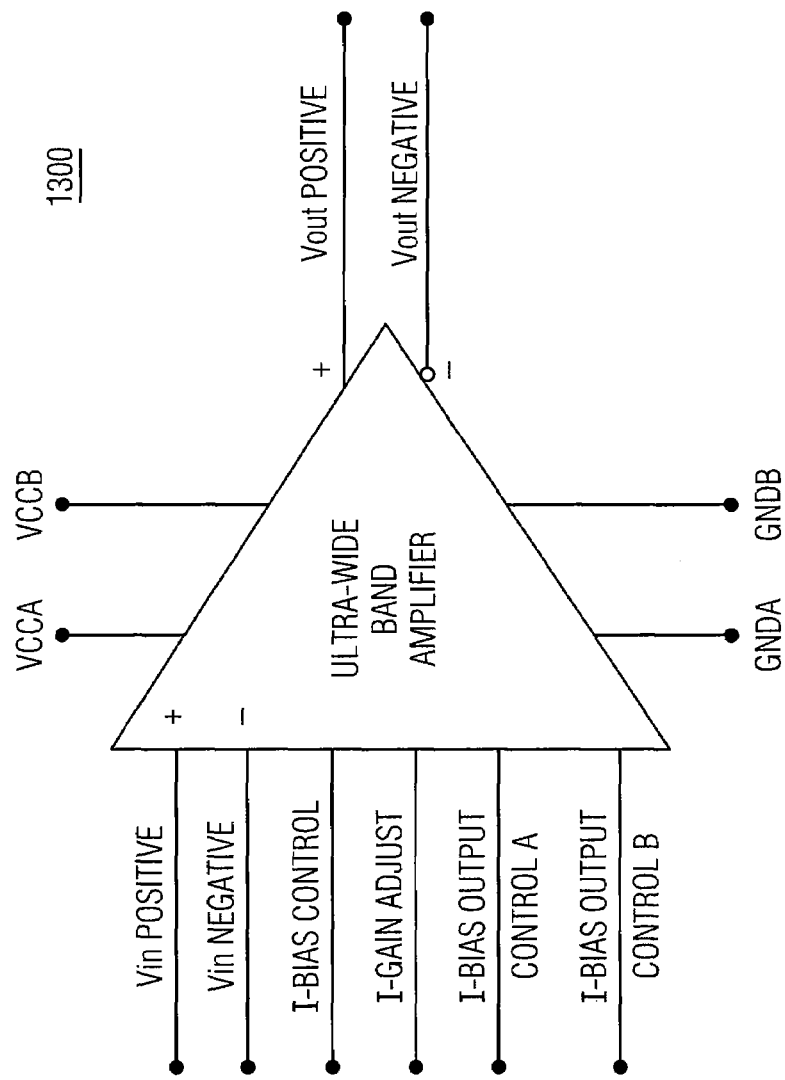
FIG. 13 is a functional diagram of a two-stage ultra wide band amplifier, in accordance with another embodiment of the present invention.
Figure 14:
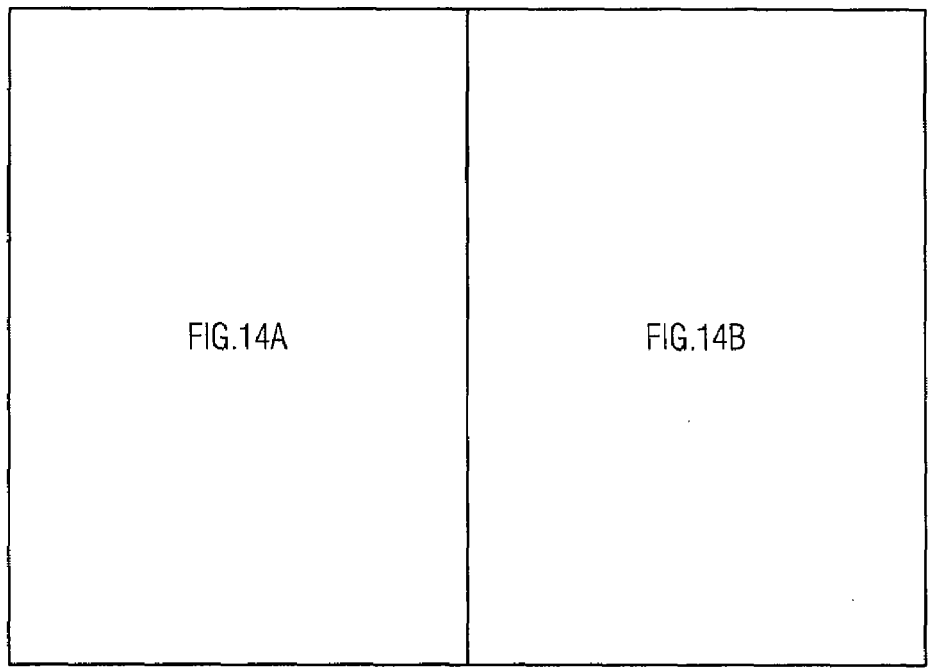
FIG. 14 is a detailed schematic diagram of the two-stage ultra wide band amplifier of FIG. 13, in accordance with another embodiment of the present invention.
Figure 14A:
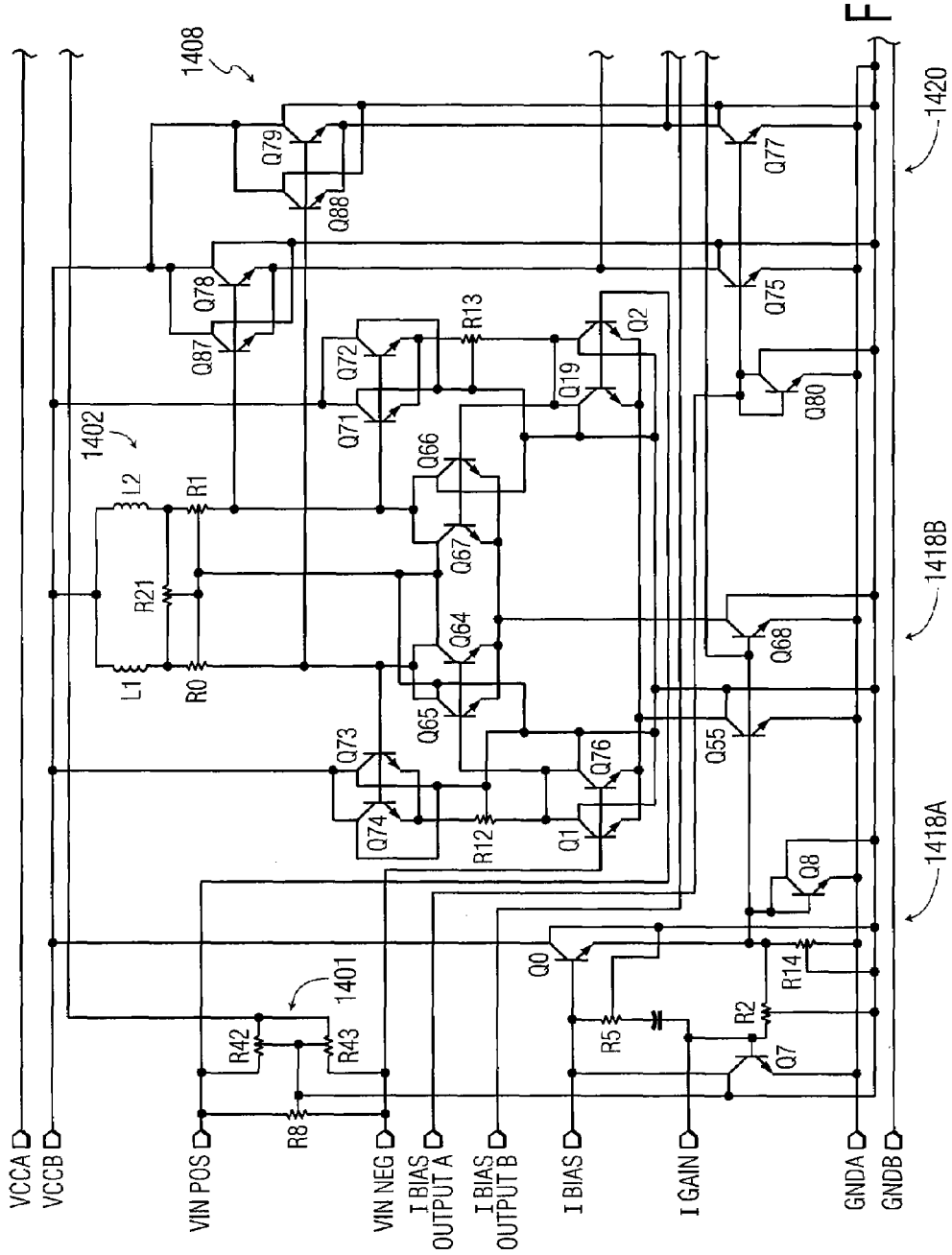
Figure 14B:
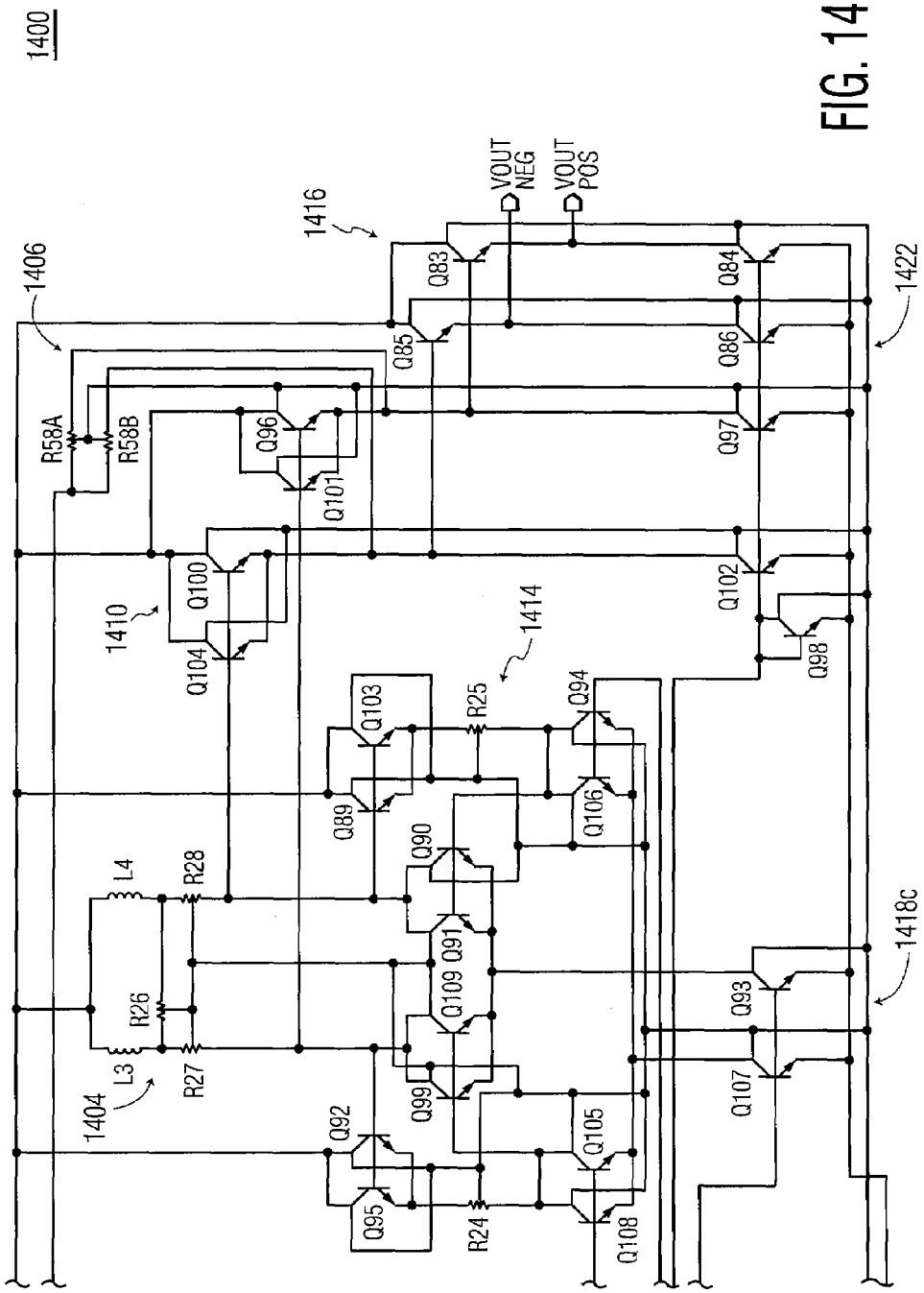
Figure 15:
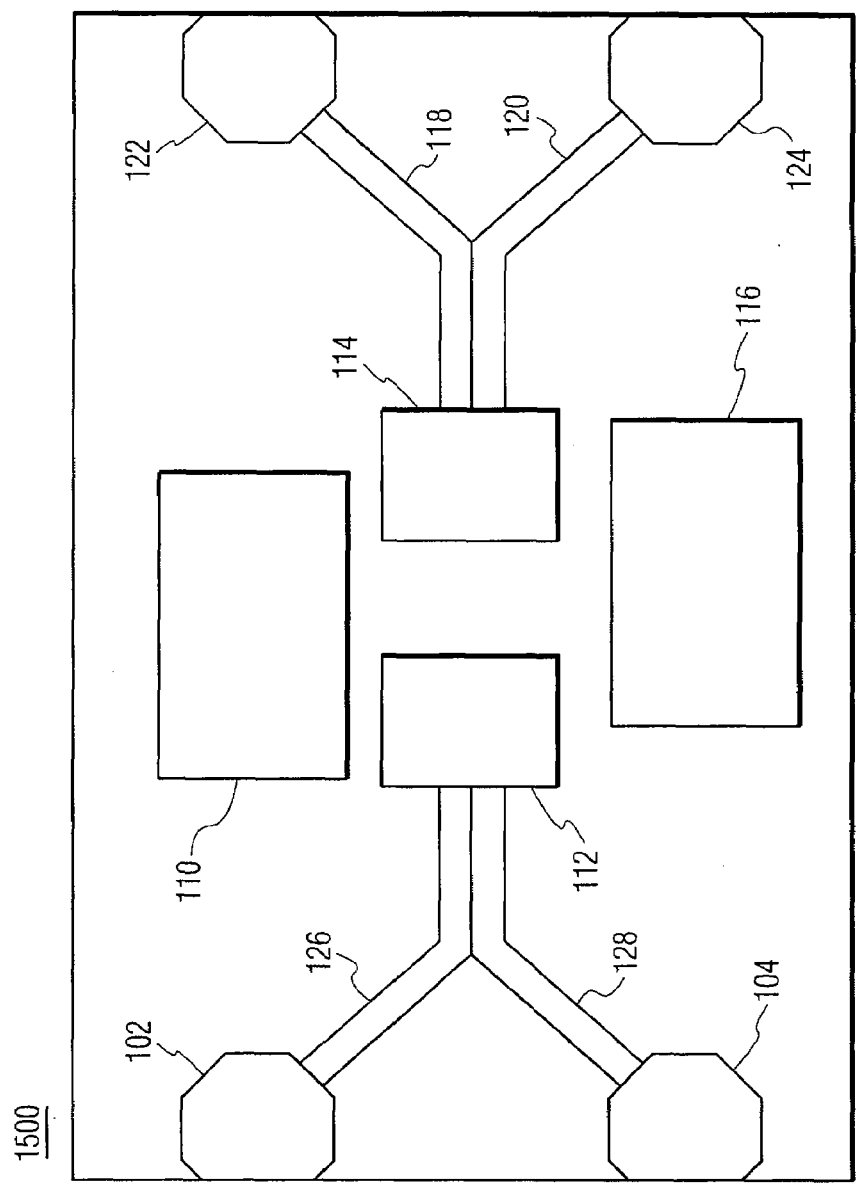
FIG. 15 is a layout diagram showing approximate sizes of various elements of the two-stage ultra wide band amplifier of FIG. 14, in accordance with an embodiment of the present invention.

Referring next to FIGS. 13, 14 and 15, there is shown another embodiment of the present invention. This embodiment is different from the embodiment shown in FIGS. 1 and 2 (single stage amplifier) in that it includes a two stage amplifier and provides a substantially constant gain of 30 dBv across its ultra wide band frequency response.

Similar to the single stage amplifier, the two stage amplifier provides an ultra wide band amplifier operating between direct current (dc) and frequencies greater than 20 GHz. The two stage amplifier includes bandwidth peaking that extends the frequency response of the two stage amplifier and provides a nearly constant gain across its ultra wide band. In addition, the two stage amplifier receives a pair of differential input signals and transmits a pair of differential output signals. The two stage amplifier also includes a controlled input impedance and a controlled output impedance.

Referring first to FIG. 13, there is shown the two stage ultra wide band amplifier, designated as 1300. Similar to the one stage amplifier 10 shown in FIG. 1, two stage amplifier 1300 includes a differential pair of input signals and a differential pair of output signals. Two separate VCC primary voltages are supplied to the two stage amplifier, as shown, where VCCA and VCCB are both nominally 3.0 volts dc. Two separate grounds are provided, as shown, ground A and ground B. The bias and gain adjust controls of two stage amplifier 1300 is similar to the one stage amplifier 10, except that two separate I-bias output controls are provided at the input side of the amplifier, namely I-bias output control A and I-bias output control B.

Referring next to FIG. 14, there is shown a detailed schematic diagram of the two stage ultra wide band amplifier, generally designated as 1400. As shown, impedance and voltage bias control network 1401 and common mode bias network 1406 are similar to impedance and voltage bias control network 12 and common mode bias network 16, previously described with respect to the single stage ultra wide band amplifier 10.

Two bandwidth peaking networks are included in the two stage ultra wide band amplifier 1400, namely bandwidth peaking network 1402 and bandwidth peaking network 1404. Furthermore, two core amplifiers are serially connected, as shown by first stage core amplifier 1412 and second stage core amplifier 1414. Two separate output buffers, designated as 1408 and 1410 are included in the ultra wide band amplifier 1400. A final output stage is also included and is shown designated as 1416.

In more detail, buffer 1408 includes emitter follower transistors Q87, Q78, Q88 and Q79. As shown, the bases of these transistors are connected directly to the bandwidth peaking network 1402. Similarly, output buffer 1410 includes emitter follower transistors Q104, Q100, Q101 and Q96. This latter combination of transistors are connected directly to bandwidth peaking network 1404. The final output buffer 1416 includes emitter follower transistors Q85 and Q83.

First output bias network 1420 includes transistors Q80, Q75 and Q77. The bases of transistors Q75 and Q77 are connected together to provide the same amount of collector current to bias each of the emitter follower transistors in the first stage buffer. The second output bias network 1422 includes transistors Q98, Q102, Q97, Q86 and Q84. The bases of transistors Q102, Q97, Q86 and Q84 are connected together to provide the same amount of collector current to bias each of the emitter follower transistors in the second stage of buffers. It will be appreciated that the first and second output bias networks operate in a manner that is similar to the operation of the output bias network described with respect to the one stage ultra wide band amplifier 10.

Lastly, the core bias network, designated as 1418A, 1418B and 1418C, provide bias currents to first stage core amplifier 1412 and second stage core amplifier 1414. Transistors Q55 and Q68 bias the first stage core amplifier and transistors Q107 and Q93 bias the second stage core amplifier. It will be seen that the bases of these transistors are connected together and coupled to bleeding transistor Q8, thereby providing an operation that is similar to the operation of the core bias network described with respect to the single stage ultra wide band amplifier 10.

The two stage ultra wide band amplifier shown in FIG. 14 is implemented using selective-epitaxial SiGe bipolar transistors. The transistors depicted in FIG. 14 may also be implemented using other materials including, but not limited to silicon, GaAs, InP, and AlGaAs.

Continuing the description of the figures, FIG. 15 depicts an approximate physical layout of the two stage ultra wide band amplifier on die 1500. As shown, input pads 102 and 104 are coupled by two transmission lines 126 and 128 to core amplifier 112. Similarly, core amplifier 114 is coupled by way of transmission lines 118 and 120 to output pads 122 and 124. It will be appreciated that the output buffers and the biasing networks have been omitted and may be considered to be within portion 112 and portion 114 of the layout. The first bandwidth peaking network is shown designated as 110 and the second bandwidth peaking network is shown designated as 116. The bandwidth peaking networks are arranged on opposite portions of die 1500 in order to minimize mutual interference.

It will be appreciated that the input and output transmission lines provide a controlled impedance of 50 ohms and are each approximately 25 microns in width.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wide band amplifier comprising:
a core amplifier having input terminals and output terminals for, respectively, receiving differential input signals and providing amplified differential output signals,
a bandwidth peaking network including (a) a first coil and a first resistor connected in series and (b) a second coil and a second resistor connected in series, and
the first coil and resistor and the second coil and resistor, respectively, coupled to the core amplifier for receiving the amplified differential output signals,
the bandwidth peaking network includes (a) a first node formed between the first coil and resistor and (b) a second node formed between the second coil and resistor, and
further including a third resistor connected between the first node and the second node.

2. The amplifier of claim 1
wherein the third resistor is free-of current flow at low frequency operation of the amplifier.

3. The amplifier of claim 1 wherein
the first and second resistors have equal resistance values, and
the third resistor has a resistance value substantially similar to the first or second resistor.

4. The amplifier of claim 1 wherein
the bandwidth peaking network is configured to provide a substantially constant gain across the frequency bandwidth of the amplifier.

5. A wideband amplifier comprising:
a core amplifier having input terminals and output terminals for, respectively, receiving differential input signals and providing amplified differential output signals,
a bandwidth peaking network including (a) a first coil and a first resistor connected in series and (b) a second coil and a second resistor connected in series,
the first coil and resistor and the second coil and resistor, respectively, coupled to the core amplifier for receiving the amplified differential output signals, and a common mode bias network coupled between the output terminals for providing a voltage bias control feedback signal across the input terminals, wherein the voltage bias control feedback signal provides a virtual ground common mode potential.

6. The amplifier of claim 5 wherein
the common mode potential across the input terminals is substantially equal to a DC potential across the output terminals.

7. The amplifier of claim 6 wherein
the differential input signals and the amplified differential output signals have substantially the same DC voltage bias.

8. A wide band amplifier comprising
a core amplifier having input terminals and output terminals for, respectively, receiving differential input signals and providing amplified differential output signals, the core amplifier including a first amplifier and a second amplifier for receiving the differential input signals, a bandwidth peaking network including (a) a first coil and a first resistor connected in series, (b) a second coil and a second resistor connected in series, (c) a first node formed between the first coil and first resistor and a second node formed between the second coil and second resistor, and (d) a third resistor connected between the first node and the second node, and the first amplifier coupled to an end of the first resistor, and the second amplifier coupled to an end of the second resistor, wherein the bandwidth peaking network is configured to increase the frequency bandwidth of the core amplifier.

9. The amplifier of claim 8 wherein the third resistor is free-of current flow at low frequency operation of the core amplifier.

10. The amplifier of claim 8 wherein the first and second amplifiers each includes:

first and second sub-stages of amplification, and (a) the first and second sub-stages of amplification of the first amplifier and (b) the first and second sub-stages of amplification of the second amplifier are configured as physically similar to each other on a die.

11. The amplifier of claim 10 wherein
the first sub-stage of amplification of the first amplifier and the first sub-stage of amplification of the second amplifier are formed in a common centroid configuration on the die, and the second sub-stage of amplification of the first amplifier and the second sub-stage of amplification of the second amplifier are formed in another common centroid configuration on the die.

12. The amplifier of claim 10 wherein
the first sub-stage of amplification of the first amplifier and the first sub-stage of amplification of the second amplifier are biased by a common voltage reference point, and the second sub-stage of amplification of the first amplifier and the second sub-stage of amplification of the second amplifier are biased by the same common voltage reference point.

13. The amplifier of claim 12 wherein
the common voltage reference point includes a voltage level provided into bases of a plurality of transistors, and a first collector of the plurality of transistors supplies a first collector current for biasing the first sub-stages of amplification, and a second collector of the plurality of transistors supplies a second collector current for biasing the second sub-stages of amplification.

14. The amplifier of claim 13 wherein
the first collector current and the second collector current are substantially similar to each other.

15. The amplifier of claim 13 wherein
the first collector current and the second collector current are proportional to each other, based on a ratio of the physical sizes on the die of the respective transistor supplying the first collector current and the respective transistor supplying the second collector current.

16. The amplifier of claim 13 wherein
current levels of the first and second collector currents are adjustable, and the current levels are adjustable to provide a gain amount of approximately 10 dBv for the core amplifier.

17. A wide band amplifier comprising
a core amplifier having input terminals and output terminals for, respectively, receiving differential input signals and providing amplified differential output signals, the core amplifier including a first amplifier and a second amplifier for, respectively, receiving the differential input signals, a bandwidth peaking network including (a) a first coil and a first resistor connected in series, (b) a second coil and a second resistor connected in series, (c) a first node formed between the first coil and first resistor and a second node formed between the second coil and second resistor, and (d) a third resistor connected between the first node and the second node, and the first amplifier coupled to an end of the first resistor, and the second amplifier coupled to an end of the second resistor, wherein the bandwidth peaking network is configured to increase the frequency bandwidth of the core amplifier, and the bandwidth peaking network is configured to provide a substantially constant gain across the frequency bandwidth of the core amplifier.

18. The amplifier of claim 17 further including
a common mode bias network coupled between the output terminals for providing a voltage bias control feedback signal across the input terminals, wherein the voltage bias control feedback signal provides a virtual ground common mode potential.

19. The amplifier of claim 18 wherein
the common mode potential across the input terminals is substantially equal to a DC potential across the output terminals.

20. The amplifier of claim 19 wherein
the differential input signals and the amplified differential output signals have substantially the same DC voltage bias.

* * * * *